United States Patent [19]

Nagano

[11] Patent Number: 5,945,882
[45] Date of Patent: Aug. 31, 1999

[54] SYNCHRONIZING METHOD OF DISTRIBUTED REFERENCE OSCILLATION SYSTEMS AND REFERENCE OSCILLATION GENERATION APPARATUS

[75] Inventor: Seido Nagano, Tokyo, Japan

[73] Assignee: NEC Corporation, Tokyo, Japan

[21] Appl. No.: 09/040,464

[22] Filed: Mar. 18, 1998

[30] Foreign Application Priority Data

Mar. 18, 1997 [JP] Japan ................................ 9-064677

[51] Int. Cl.$^6$ .......................... H03L 7/00; H04L 7/00
[52] U.S. Cl. ...................... 331/55; 327/146; 375/356
[58] Field of Search ........................ 331/55; 327/144, 327/146; 370/507; 375/354, 356

[56] References Cited

U.S. PATENT DOCUMENTS

| | | | |
|---|---|---|---|
| 3,859,466 | 1/1975 | Hartmann | 370/507 |
| 4,042,781 | 8/1977 | Dragotinov | 375/356 |
| 5,361,277 | 11/1994 | Grover | 375/356 |
| 5,812,497 | 9/1998 | Yahata | 375/356 |

FOREIGN PATENT DOCUMENTS 8-314567  11/1996  Japan .

OTHER PUBLICATIONS

Martiel et al., "Model Based on Receptor Desensitization for Cyclic AMP Signaling in Dictyostelium Cells", J. Biophysical Society, vol. 52, pp. 807–828 (1987).

*Primary Examiner*—Siegfried H. Grimm
*Attorney, Agent, or Firm*—Foley & Lardner

[57] ABSTRACT

Waves such as radio-waves, sound waves, or electric current waves are used for communication among system units. Each system unit includes a reference oscillation generation apparatus which receives as input a sum of a sent wave and a received wave. An upper limit and a lower limit for input amplitude range is set in said reference oscillation generation apparatus. The apparatus modulates the output (sent wave) so as to meet the input amplitude range so that synchronization among a large number of distributed reference oscillation generation systems is attained. As a result, it becomes possible to eliminate phase differences among reference oscillation systems added to a large number of distributed system units and attain synchronization.

6 Claims, 2 Drawing Sheets

SYNCHRONIZING METHOD OF DISTRIBUTED REFERENCE OSCILLATION SYSTEMS AND REFERENCE OSCILLATION GENERATION APPARATUS

BACKGROUND OF THE INVENTION

1. Field of the Invention

The present invention relates to a synchronizing method of distributed reference oscillation systems, each of which is incorporated in or added to each of a plurality of distributed system units and a reference oscillation generation apparatus. More particularly, the present invention relates to a synchronizing method of distributed reference oscillation systems and a reference oscillation generation apparatus, wherein synchronization among system units is implemented to attain cooperation of all systems and improve the ability of all systems.

2. Description of the Related Art

Synchronizing methods of conventional reference oscillation systems are classified into the following two categories. (1) One reference oscillation generation system is prepared, and synchronizing between receiving systems is implemented by making the distance between the reference oscillation generation system and other systems receiving signals constant. (2) A circuit for sensing a phase difference between a wave sent from one system unit and a wave received by the other system and adjusting the reference oscillation is incorporated and thereby synchronizing between them is implemented. In the case where there are multiple system units, this method is utilized in multiple stages.

For constructing a large scale system from many small scale inexpensive systems and making full use of its ability, it is indispensable to implement synchronization between small scale systems and make joint work possible.

Due to its mechanism, however, the conventional synchronizing method has a drawback that the technical difficulty for dissolving the problem with delays increases abruptly as the number of the system units increases.

SUMMARY OF THE INVENTION

An object of the present invention is to provide a synchronizing method of distributed reference oscillation systems and a reference oscillation generation apparatus for efficiently implementing synchronization of reference oscillation among a large number of system units in order to make possible joint work among the above described distributed system units.

In accordance with the present invention, there is provided a synchronizing method of distributed reference oscillation systems. Said method comprises the steps of: adopting a nonlinear circuit as a reference oscillation circuit of each of distributed system units, said nonlinear circuit receiving as input a sum of an output of said nonlinear circuit and outputs of the other nonlinear circuit of the other distributed system units; and adjusting said output of said nonlinear circuit so as to restore a state of said input before a change in said sum of said input has occurred, and thereby making phase differences of reference oscillations among the system units disappear.

According to the second aspect of the present invention, there is provided a synchronizing method of distributed reference oscillation generation systems, which comprises the steps of: adopting waves such as radio-waves, sound waves, electric current waves, or optical waves for communication among a plurality of system units; applying a sum of a wave sent from one system unit and a wave sent from another system unit and received in said one system unit as input of said one system unit; and modulating a wave output from said one system unit in response to an amplitude change of said input of said one system unit.

A synchronizing method according to the third aspect of the present invention comprises the steps of: adopting waves such as radio-waves, sound waves, electric current waves, or optical waves for communication among a plurality of system units; applying a synthetic wave obtained by combining a wave sent from one system unit and waves sent from all other system units and received in said one system unit as input of said one system unit; and adjusting a wave output from said one system unit in response to a change of said input of said one system unit and adjusting waves output from all other system units as well in response to changes of respective inputs of said other system units, thereby attaining synchronization among all system units.

A reference oscillation generation apparatus according to the fourth aspect of the present invention comprises: reference oscillation generation source; means for inputting to the reference oscillation generation source the sum of the output of said reference oscillation generation source and outputs of other reference oscillation generation source of other system units; means for sensing a change of said sum; and means for adjusting said output of said reference oscillation generation source so as to control said sum in a range to attain synchronization among a plurality of reference oscillation generation sources.

The output of said reference oscillation generation source may be connected to a connection line. Said connection line is connected to terminators and output of other reference oscillation sources are also connected to said connection line. Said input of each of said reference oscillation generation sources may be connected to said connection line at two points so as to sandwich a point of connection of said output of that reference oscillation generation sources to said connection line.

In the case of the electric current, it is necessary that the input is connected to two points. For inputting outputs of other reference oscillation systems together with the output of itself, it is desirable that the input is connected to the connection line at two points so as to sandwich the connection point of the output of itself between the two points.

The present invention provides a method for attaining the synchronization rapidly and flexibly among an arbitrary number of distributed reference oscillation generation systems, which was very difficult to attain in the conventional synchronizing method of reference oscillation systems. Furthermore, the conventional method has a problem that synchronizing becomes difficult as the reference frequency increases. On the contrary, in the case of the present invention, the time required-for attaining the synchronization becomes shorter and the synchronizing ability is improved as the reference frequency increases.

DESCRIPTION OF THE PREFERRED EMBODIMENTS

Now, the preferred embodiments will be described with reference to the accompanying drawings.

Figure 1:
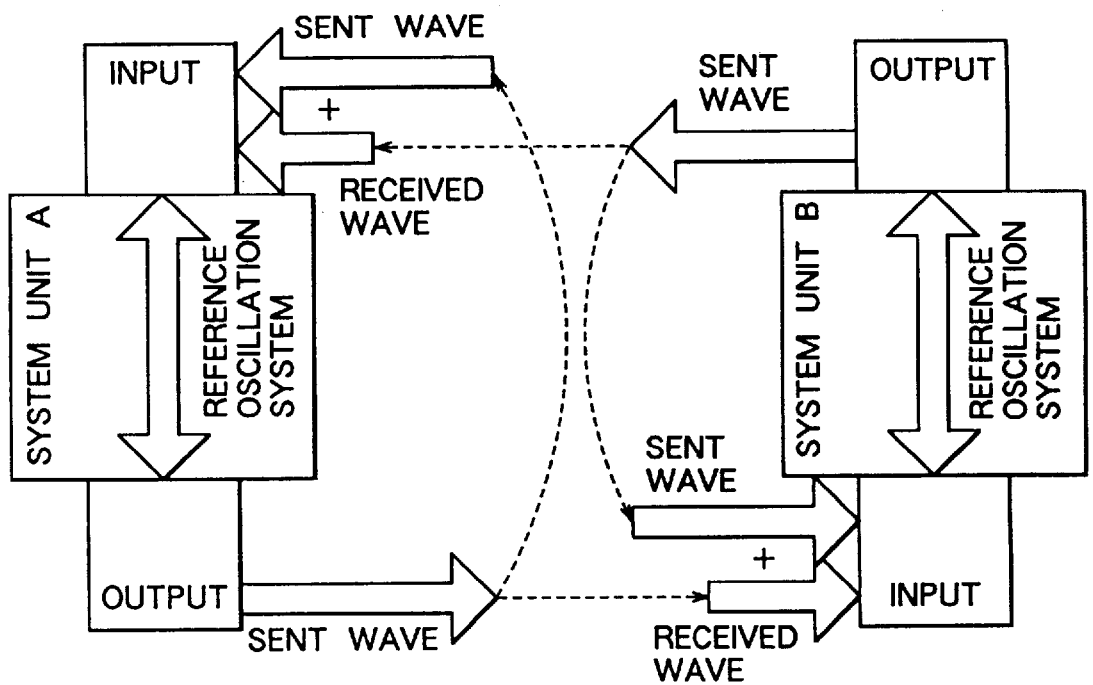
FIG. 1 is a diagram illustrating the concept of synchronization according to the method of the present invention.

In order to quickly attain the synchronization of reference oscillations among a large number of distributed system units, the present inventors eagerly promoted studies. As a result, the present inventors found that the problems of the conventional method were dramatically solved by a technique based upon adding the following reference oscillation generation circuit system to each system unit. The reference oscillation generation circuit system is supplied with, as its input, a synthetic wave obtained by combining a sent wave and a received wave sent from another system unit as shown in FIG. 1. The reference oscillation generation circuit system applies modulation to the sent wave output therefrom so as to put its input wave in a range determined by an upper limit value and a lower limit value set for the amplitude of the input wave.

In the case where there is only one unit, it is a matter of course that both the input and the output are the same sent wave. In the case where signals from other system units are received, however, it is a matter of course that the synthetic wave of the sent wave and the received wave is different from the sent wave. As a result, the input to the reference oscillation generation circuit changes.

In addition, the amplitude and phase of the received wave which becomes a part of the input contain both information of distance values to other system units and initial phase information of respective system units which does not depend upon the distance.

In other words, it can be said that the reference oscillation generation circuit receives necessary and sufficient information for attaining synchronization as its input from each system unit. And so as to satisfy the upper limit and the lower limit of the input wave, the reference oscillation generation circuit applies modulation to the sent wave output from itself.

As a matter of course, this modulation of the sent wave applies modulation to inputs of other system units receiving that sent wave as well, and eventually urges modulation of the sent waves output by other system units.

As a result of repetition of such an exchange among the system units, synchronization of reference oscillation in the entire system unit group is attained after a fixed time.

Figure 2:
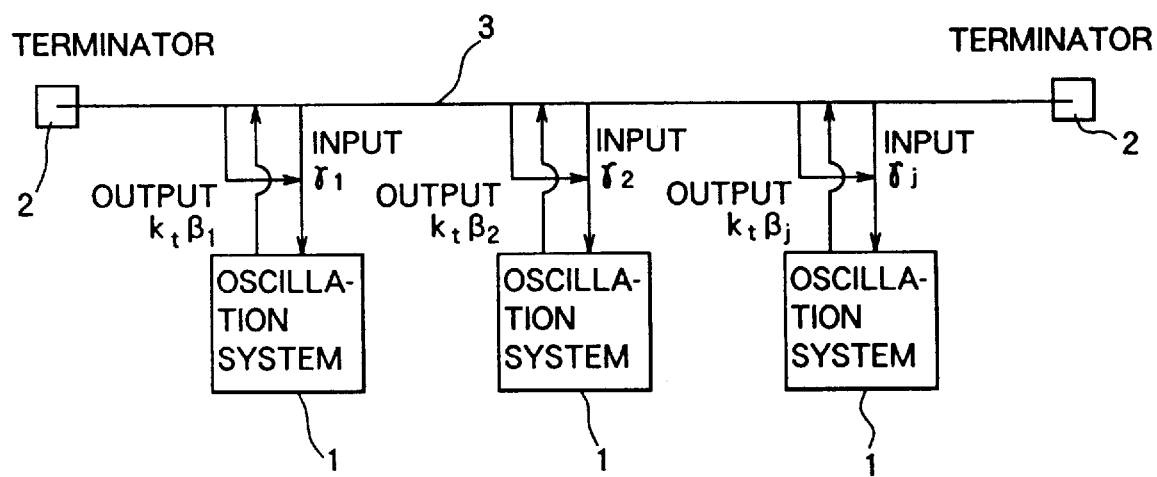
FIG. 2 is a diagram showing an embodiment of a reference oscillation generation apparatus according to the present invention.

As shown in FIG. 2, each of oscillation systems 1 of the same type capable of generating an electric current wave having a fixed frequency and fixed amplitude is provided in each of system units.

A connection line 3 is connected to the terminators 2 and inputs and outputs of the plurality of reference oscillation systems 1 are connected to the connection line 3.

The reference oscillation generation system 1 outputs a reference oscillation wave and inputs reference oscillation wave sent from other reference oscillation generation systems 1 of other system units. The oscillation system 1 also input the reference oscillation wave sent from itself. Namely, the oscillation system 1 inputs the sum of the output of itself and the output of the other oscillation systems 1. The oscillation system 1 senses a change of the input and adjusts the output of the reference oscillation wave to attain synchronization among a plurality of reference oscillation generation systems 1.

The input of each of the reference oscillation systems 1 is connected to the connection line 3 at two points so as to sandwich a point of connection of the output of that reference oscillation system 1 to the connection line 3. In the case of the electric current, it is necessary that the input is connected to two points. For inputting outputs of other reference oscillation circuits together with the output of itself, it is desirable that the input is connected to the connection line at two points so as to sandwich the connection point of the output of itself.

This oscillation system 1 is formed so as to change in both frequency and amplitude according to a change in its input signal. As its input signal, a synthetic wave obtained by combining the sent wave from itself and received waves in the oscillation system 1 sent from other system units is input to the oscillation system 1. Furthermore, the oscillation system 1 is set so that a decrease of the amplitude of the input signal beyond the lower limit value will cause automatic modulation of the sent wave to make the input signal recover the original amplitude and an increase of the amplitude of the input signal beyond the upper limit value will cause automatic modulation of the sent wave to consequently make the input signal decrease. This is implemented by, for example, setting each oscillation circuit so as to satisfy equations (1) through (4), where $\beta j$ and $\gamma j$ are respectively the output and input of a jth oscillation system 1.

$$d\beta j/dt = \phi(\rho j, \gamma j) - (ki+kt)\beta j \qquad (1)$$

$$d\rho i/dt = fj(\gamma j)(1-\rho j) - f1(\gamma j)\rho j \qquad (2)$$

$$f1(\gamma j) = (k1+k2\gamma j)/(1+\gamma j), f2(\gamma j) = (k3+k4\gamma j)/(1+10\gamma j) \qquad (3)$$

$$\phi(\rho j, \gamma j) = 1800(0.001+Yj^2)Yj/(0.2575+Yj^2) = \rho j \gamma j/(1+\gamma j) \qquad (4)$$

In the equations, k1, k2, k3, k4, ki and kt are appropriate constants common to the oscillation circuits. By combination of them, fundamental characteristics are determined. Simulation experiments of a large number of system units including such a circuit were conducted.

As a result, synchronization was attained within one cycle in the case where the distance between system units was short. As the distance was increased, however, the number of cycles required until the synchronization was attained gradually increased. This is because the communication time between system units is limited by the propagation speed of the wave adopted as the communication means.

On the other hand, when the distance was fixed and the reference frequency was changed, a substantial change was not observed in the number of cycles required until the synchronization was attained, and the synchronization among the system units was attained in a shorter time as the fundamental frequency was increased. As a result of inspection conducted by increasing the number of the system units up to 80, a change in the situation was not found until the synchronization was attained.

Figure 3A:
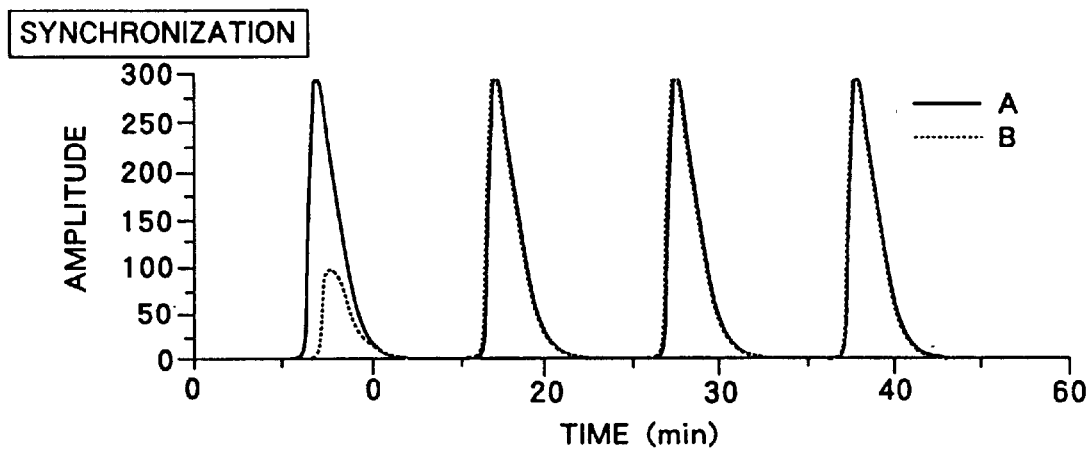
FIGS. 3A and 3B show graphs obtained before and after carrying out the synchronizing method according to the present invention.
Figure 3B:
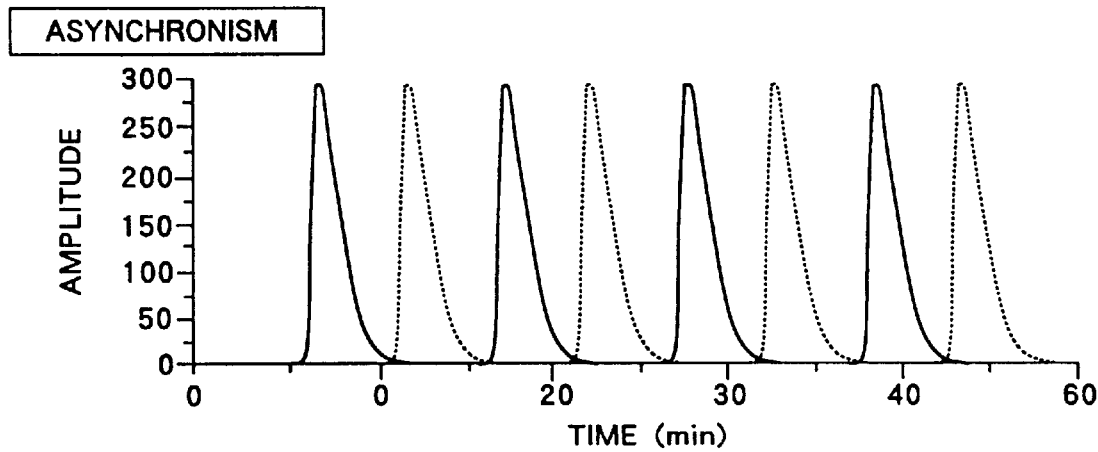

FIGS. 3A and 3B are diagrams showing synchronization phenomena occurring in the case where two reference oscillation systems are present in an embodiment of the present invention. As an example, the distance between two reference oscillation systems A and B was set equal to 15 times the size of each system. And at time zero, oscillation of system A was started. Five minutes later, oscillation of system B was started. As shown in FIG. 3B, if at this time synchronization is not attained, oscillations having completely opposite phases occur in system A and system B, which is "Asynchronism." As shown in FIG. 3A, if the synchronizing effect of the present invention is incorporated, however, the phase difference between two oscillation movements disappears approximately half a period later, which is "Synchronization."

What is claimed is:

1. A synchronizing method of distributed reference oscillation systems comprising the steps of:

adopting a nonlinear circuit as a reference oscillation circuit of each of distributed system units, said nonlinear circuit receiving as input a sum of an output of said nonlinear circuit and outputs of the other nonlinear circuits of the other distributed system units; and adjusting said output of said nonlinear circuit so as to restore a state of said input before a change in said sum of said input has occurred, and thereby making phase differences of reference oscillations among the system units disappear.

2. A synchronizing method of distributed reference oscillation generation systems comprising the steps of:

adopting waves such as radio-waves, sound waves, electric current waves, or optical waves for communication among a plurality of system units;

applying a sum of a wave sent from one system unit and a wave sent from another system unit and received in said one system unit as input of said one system unit; and modulating a wave output from said one system unit in response to an amplitude change of said input of said one system unit.

3. A synchronizing method of distributed reference oscillation generation systems comprising the steps of:

adopting waves such as radio-waves, sound waves, electric current waves, or optical waves for communication among a plurality of system units;

applying a synthetic wave obtained by combining a wave sent from one system unit and waves sent from all other system units and received in said one system unit as input of said one system unit; and adjusting a wave output from said one system unit in response to a change of said input of said one system unit and adjusting waves output from all other system units as well in response to changes of respective inputs of said other system units, thereby attaining synchronization among all system units.

4. A reference oscillation generation apparatus comprising:

a reference oscillation generation source;

means for inputting to the reference oscillation generation source the sum of the output of said reference oscillation generation sources and outputs of other reference oscillation generation source of other system units;

means for sensing a change of said sum; and means for adjusting said output of said reference oscillation generation source so as to control said sum in a range to attain synchronization among a plurality of reference oscillation generation sources.

5. A reference oscillation generation apparatus according to claim 4, wherein said output of said reference oscillation generation source is connected to a connection line, said connection line being connected to terminators and outputs of other reference oscillation generation sources being also connected to said connection line.

6. A reference oscillation generation apparatus according to claim 5, wherein said input of each of said reference oscillation generation sources is connected to said connection line at two points so as to sandwich a point of connection of said output of that reference oscillation generation sources to said connection line.

* * * * *